United States Patent [19]  
Cavaliere et al.

[11] 4,338,138  
[45] Jul. 6, 1982

[54] PROCESS FOR FABRICATING A BIPOLAR TRANSISTOR

[75] Inventors: Joseph R. Cavaliere, Hopewell Junction, N.Y.; Cheng T. Horng, San Jose, Calif.; Richard R. Konian, Poughkeepsie; Hans S. Rupprecht, Yorktown Heights, both of N.Y.; Robert O. Schwenker, San Jose, Calif.

[73] Assignee: International Business Machines Corporation, Armonk, N.Y.

[21] Appl. No.: 126,611

[22] Filed: Mar. 3, 1980

[51] Int. Cl.³ ............... H01L 21/263; H01L 21/203; H01L 21/22; H01L 21/31
[52] U.S. Cl. .................................. 148/1.5; 148/187; 357/34; 357/58; 357/59; 357/91
[58] Field of Search ............... 148/1.5, 187; 357/34, 357/59, 91, 58

[56] References Cited
U.S. PATENT DOCUMENTS

| | | | |
|---|---|---|---|
| 3,574,008 | 4/1971 | Rice | 148/175 |
| 3,655,457 | 4/1972 | Duffy et al. | 148/1.5 |
| 3,796,613 | 3/1974 | Magdo et al. | 148/175 |
| 3,975,221 | 8/1976 | Rodgers | 357/23 |
| 4,047,217 | 9/1977 | McCaffrey | 357/34 |
| 4,048,649 | 9/1977 | Bohn | 357/43 |
| 4,080,619 | 3/1978 | Suzuki | 357/34 |
| 4,104,086 | 8/1978 | Bondur et al. | 148/187 |
| 4,115,797 | 9/1978 | Hingarh et al. | 148/187 |
| 4,139,442 | 2/1979 | Bondur et al. | 357/50 |
| 4,157,269 | 6/1979 | Ning et al. | 357/91 |
| 4,242,791 | 1/1981 | Horng et al. | 357/91 |
| 4,252,582 | 2/1981 | Anantha et al. | 148/187 |

Primary Examiner—Upendra Roy  
Attorney, Agent, or Firm—Wesley DeBruin

[57] ABSTRACT

An improved bipolar transistor structure formed in a very small area of a thin epitaxial layer on a planar surface of a silicon substrate of first conductivity type, said very small area of the thin epitaxial layer having vertical sidewalls extending to the planar surface of said substrate, said area of thin epitaxial layers containing in the order recited a shallow depth emitter region of a second conductivity type having an exposed planar surface, a shallow depth base region of said first conductivity type, and a shallow depth active collector region of said second conductivity type, an elongated region of said first conductivity type surrounding said emitter, base and active collector regions, said elongated region being contained within and coextensive with said vertical sidewalls of said small area of said thin epitaxial layer, whereby the base collector capacitance is materially reduced due to the very small area of the base-collector junction. Also disclosed is a process and alternative process, for fabricating an improved bipolar transistor structure.

4 Claims, 24 Drawing Figures

PROCESS FOR FABRICATING A BIPOLAR TRANSISTOR

FIELD OF THE INVENTION

This invention relates to the fabrication and structure of semiconductor devices, and, in particular, to very small integrated circuit bipolar devices with very high speed and very low power performance.

A planar self-aligned bipolar transistor structure in which the emitter, base and collector are self-aligned. The structure provides in a very small discrete area of a thin epitaxial layer on a planar surface of a silicon substrate a shallow depth emitter region, a shallow depth base region and a shallow depth active collector region in the order recited. The small discrete area of the thin epitaxial layer has vertical sidewalls. Said very small discrete area of the epitaxial layer having co-extensive with said vertical sidewalls an elongated region of a conductivity type corresponding to the conductivity type of said shallow depth base region.

Further encompassed, is a process and alternative process, respectively comprising a number of steps, for fabricating a structure in accordance with the invention.

BACKGROUND OF THE INVENTION AND PRIOR ART

Numerous integrated circuit devices, structures and techniques of fabricating same, are known to the prior art. The following prior art U.S. patents are submitted to generally represent the state of the art:

U.S. Pat. No. 3,574,008 entitled "Mushroom Epitaxial Growth In Tier-Type Shaped Holes" granted Apr. 6, 1971 to E. J. Rice, U.S. Pat. No. 3,655,457 entitled "Method of Making or Modifying a PN-junction by Ion Implantation" granted Apr. 11, 1972, to M. C. Duffy et al, U.S. Pat. No. 3,796,613 entitled "Method of Forming Dielectric Isolation for High Density Pedestal Semiconductor Devices" granted Mar. 12, 1974 to I. E. Magdo et al, U.S. Pat. No. 3,975,221 entitled "Low Capacitance V Groove NOR Gate and Method of Manufacture" granted Aug. 17, 1976 to T. J. Rodgers, U.S. Pat. No. 4,047,217 entitled "High-Gain, High-Voltage Transistor Integrated Circuits" granted Sept. 6, 1977 to T. McCaffrey et al, U.S. Pat. No. 4,048,649 entitled "Superintegrated V-Groove Isolated Bipolar and VMOS Transistors" granted Sept. 13, 1977 to R. Bohn, and the U.S. Pat. No. 4,080,619 entitled "Bipolar Type Semiconductor Device" granted Mar. 21, 1978 to K. Suzuki.

The present trend in semiconductor technology is toward very large scale integration of devices with very high speed and low power requirements. The parameters that are essential to such high performance bipolar transistors are low parasitic capacitances as realized by a shallow vertical junction structure and small horizontal geometry. To achieve these goals it is necessary to make the devices in the integrated circuits as small as possible.

With the advances in semiconductor processing technologies, such as in the fields of ion implantation, deep dielectric isolation, electron beam and x-ray lithographies, reactive ion etching, advanced insulator and polysilicon deposition techniques, and metal lift-off processes, fabrication of the ultrahigh performance integrated circuit devices can be achieved.

Ion implantation provides a means for precisely controlling the total amount of impurity transferred to the wafer. The impurity depth distribution is accurately controlled by implant energy. Unlike the conventional thermal diffusion process ion implantation is not a high temperature process. Thus, by using photoresist or metal masking, multiple impurity introduction operations can be achieved without resort to high temperatures. A final thermal drivein diffusion is sufficient to anneal out the radiation damage caused by implantation, and obtain desired device junction depth. Consequently, integrated circuit devices can be made shallower, with greater precision of the impurity distribution using ion implantation technology.

As the semiconductor devices become shallower, it is desirable to reduce the overall junction area so as to reduce parasitic capacitance. Further reduction of device parasitic capacitance can be achieved by shrinking of device horizontal dimensions and using dielectric isolation. Dielectric isolation is a method of fabricating integrated circuits in which the device components are isolated by other than P-N junctions. A well known dielectric isolation, namely "Recessed Oxide Isolation" (ROI) is a commonly used process in present day technology. Using $Si_3N_4$ as the oxidation barrier, the ROI technique is done by etching grooves into the semiconductor wafer adjacent those regions in which PN junctions are to be formed. The silicon exposed by the grooves is then thermally oxidized to form recessed oxide regions providing dielectric isolation. The problem associated with the ROI is the formation of "bird's head" or "bird's beak" structure at the lateral edges of recessed oxide. The bird's head is undesirable because it can cause breaks or discontinuities in thin films covering the steps. The indefiniteness of bird's beak structure reduces the available active surface area and, therefore, imposes the need for wider tolerance of lateral dimension in the integrated circuit layout. A newly developed oxide isolation technique called "Deep Dielectric Isolation" (DDI) avoids the above mentioned problem. The DDI process utilizes reactive-ion etching (RIE) to form deep narrow trenches into the wafer surrounding those regions in which devices are to be formed. (Reference is made to U.S. Pat. No. 4,104,086, entitled "Method for Forming Isolated Regions of Silicon Utilizing Reactive Ion Etching" granted Aug. 1, 1978 to J. A. Bondur et al., and U.S. Pat. No. 4,139,442 entitled "Reactive Ion Etching Method For Producing Deep Dielectric Isolation in Silicon" granted Feb. 13, 1979 to J. A. Bondur et al., respectively assigned to the assignee of the subject application.) The trenches are overfilled with $SiO_2$ put down by chemical vapor deposition (CVD) technique. The overfilled $SiO_2$ also planarizes the device surface. A blanket RIE backetching to the semiconductor surface yields deep oxide isolation trenches. Unlike the bird's beak in ROI structures, sidewalls of the DDI structures are nearly vertical. The surface of DDI regions and the silicon where they are to be formed are coplanar. With the DDI, doping processes for various device regions are then self-aligned by oxide isolation. The self-aligned process eliminates precise mask alignment steps and also saves a number of mask steps in the device fabrication.

As mentioned above, DDI enables us to form devices with considerably smaller cell size than those formed by using either P-N isolation or by ROI. Further reduction of device horizontal dimensions requires the use of high resolution capabilities of lithography and etching processes. The electron beam lithography is the most promising method for delineating submicron size device patterns. For device window openings the reactive ion etch (RIE) is the most attractive alternative to the conventional wet solution etching. The RIE is a dry process having a directional etching characteristic. The etched device windows preserve the lithography defined etch mask dimensions, and the openings have vertical sidewalls. Thus, the E-beam lithography and reactive ion etching are compatible for fabricating very small device geometries.

For the very small bipolar transistor devices, as for example, micron size transistors, the base areas and, therefore, the collector-base parasitic capacitance is the most significant performance parameter. In the bipolar transistor the active base area is the region below the emitter. In the conventional transistors, fabricated in accordance with the prior art, the base contacts are formed above the inactive base area surrounding the emitter. The transistor base area that is needed to accommodate the emitter and base contacts is considerably larger than the active base area. To reduce the base area for making ultra-high performance bipolar transistors, a different approach in providing the base contact is desirable.

SUMMARY OF THE INVENTION

It is, therefore, a primary object of the invention to provide an improved bipolar transistor and a method for fabricating same. By utilizing advanced semiconductor processing techniques, the transistor structure formed in accordance with the invention, is as shown in FIGS. 1A, 1B and 1C. An alternative structure, in accordance with the invention is depicted in FIG. 10. The method for device fabrication, in accordance with the invention, is a self-aligned process. The device formed has very small vertical as well as horizontal dimensions. The device region is surrounded by a deep oxide trench which has nearly vertical sidewalls. The deep trench extends from the epitaxial silicon surface through the N+ subcollector region into the P substrate. The width of the deep trench is about 2 $\mu$m to 3.0 $\mu$m. A shallow oxide trench extending from the epitaxial silicon surface to the upper portion of the N+ subcollector separates the base and collector contact. The surface of the dielectric isolation region and the silicon where the transistor is formed is coplanar.

As shown in FIGS. 1A, 1B, 1C (and alternatively FIG. 10), the fabricated bipolar transistor, in accordance with the invention, has a mesa-type structure. The transistor base dimension corresponds essentially to that of the emitter. This small base area results in low collector-base capacitance which is a very important parameter in ultra-high performance integrated circuit devices. Contact to the transistor base in the structure, in accordance with the invention, is achieved by a thick heavily boron doped polysilicon layer which laterally surrounds the emitter and makes lateral contact to the base. The P+ polysilicon layer, which provides low base resistance, is formed within the oxide isolation trenches, thus minimizing the parasitic capacitance. The transistor active base is formed in place by a low dosage boron implantation made with its concentration peak below the emitter. The device thus formed will have a controllable narrow base width and a low external resistance. Both are essential to provide high speed and low power devices.

The emitter of the structure, in accordance with an embodiment of the invention is separated from the P+ polysilicon of the base contact by an SiO$_2$ dielectric layer or sleeve. This dielectric separation ensures that electrons injected into the base do occur at the bottom of the emitter. The dielectric sleeve of the emitter also eliminates the sidewall hole current component normally existing in conventional transistors. Thus, the bipolar transistors formed by the process, in accordance with the invention, has a high emitter injection efficiency and also has high transistor current gains.

Furthermore, the fabricated small geometry devices have planarized surfaces. The planarized device structure ensures the thin film covering which is critical to the integration of very small devices.

The objects and advantages of the present invention will become more apparent from the following detailed description taken in conjunction with the accompanying drawings.

BRIEF DESCRIPTION OF THE DRAWINGS

FIG. 1BB is a cross-sectional view of a second, or alternative, transistor structure in accordance with the invention. FIG. 1BB of the alternative transistor structure corresponds from a cross-sectional drawing viewpoint to FIG. 1B of the first transistor structure in accordance with the invention.

FIGS. 2 through 6, 7A, 8, 9A, 10, 11A and 12 through 18 are respectively cross-sectional views disclosing a second, or alternative, transistor structure in accordance with the invention.

DESCRIPTION OF THE PREFERRED EMBODIMENTS

Figure 2:
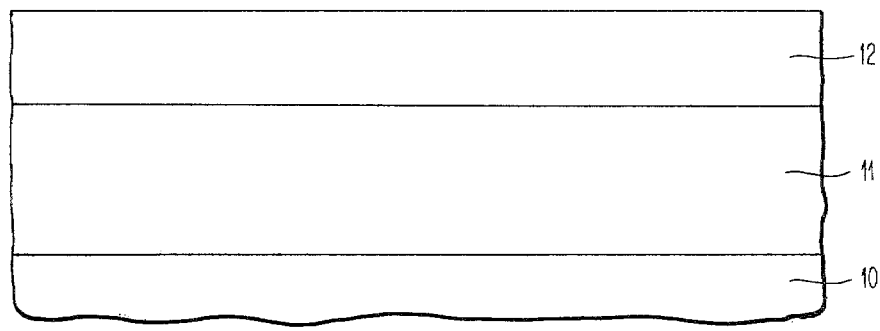
FIGS. 2 through 12 are cross-sectional views disclosing the structure at successive stages, or steps, in the process in accordance with the invention.

Referring now to the drawings and FIG. 2 in particular, a P-type monocrystalline silicon 10 is the starting substrate. An N-type impurity is then introduced into 10 forming the subcollector 11. The impurity can be any suitable N-type impurity, as for example, arsenic and can be introduced into the wafer by any suitable technique such as capsule diffusion or ion implantation. An N-type epitaxial silicon layer 12 is then deposited on the subcollector 11. The thickness of the epitaxial silicon layer 12 is about 1–2$\mu$m.

Figure 3:
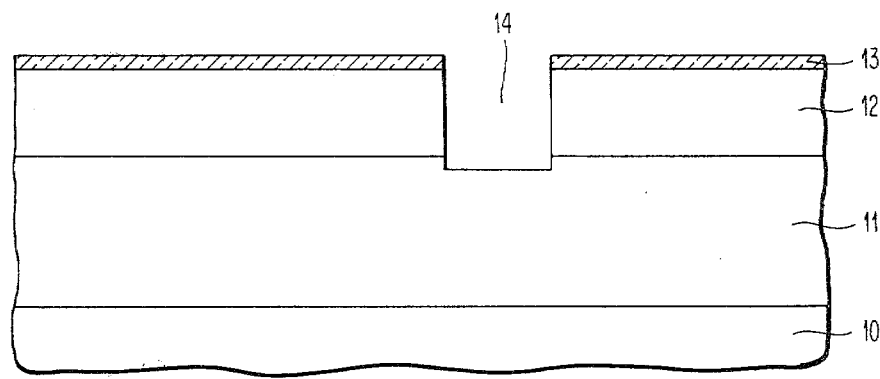

As shown in FIG. 3, an oxide layer 13, approximately 3000Å thick, preferably deposited by CVD process is formed on epitaxial layer 12. A lithography step is applied to form a resist window which overlies the intended shallow trench. The oxide layer 13 defined by the resist is then opened by using the reactive ion etch (RIE) technique. Using the unetched oxide layer 13 as an etch mask, the RIE is further used to etch through the epitaxial layer 12 to form a shallow trench 14.

Figure 4:
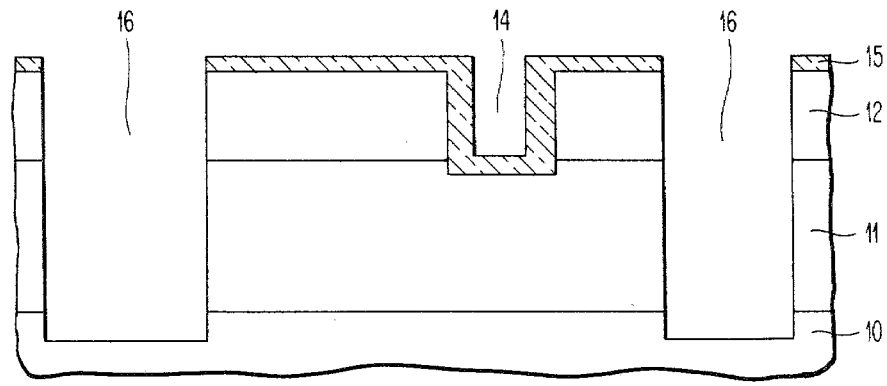

Referring to FIG. 4, an oxide layer 15, approximately 7000Å thick, is deposited on the wafer by a CVD process. Subsequently, a lithography step is performed to form a resist window which overlies the deep trench to be fabricated. The oxide 15, defined by the resist, is then opened by RIE. Using the unetched oxide 15 as an etch mask, RIE is next used to etch through the epitaxial silicon layer 12 and subcollector 11 to form the deep trench 16. Subsequently, using a thin CVD oxide layer (not shown in FIG. 4) to protect sidewalls of the deep trench 16, a boron implantation is made to form channel stop 17 in the bottom of the deep trench.

Figure 5:
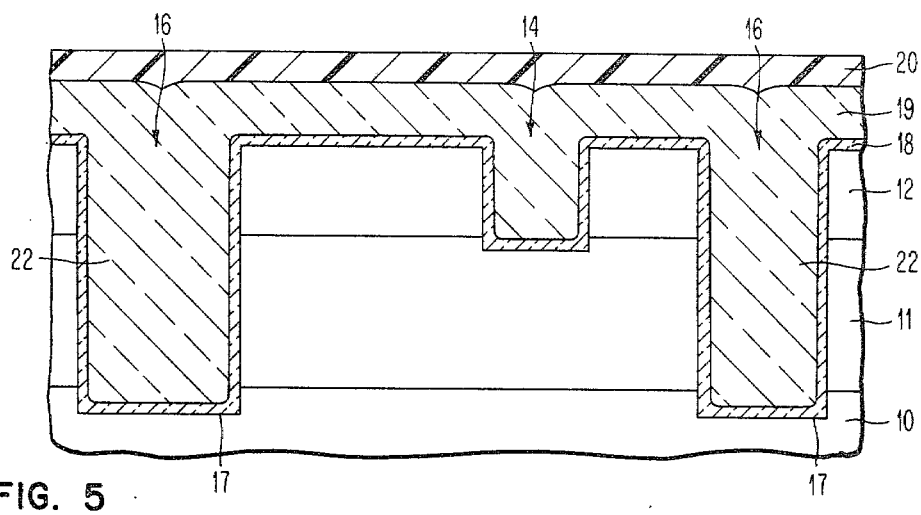

After stripping the CVD oxide, the wafer is thermally oxidized to form a high quality $SiO_2$ layer 18 over the exposed silicon surface. As shown in FIG. 5, a thick oxide layer 19 formed by low pressure CVD technique is used to fill the shallow trench 14 and deep trench 16 and also planarize the wafer surface. Next a blanket resist 20 is applied and appropriately treated to further planarize the surface 19.

Figure 6:
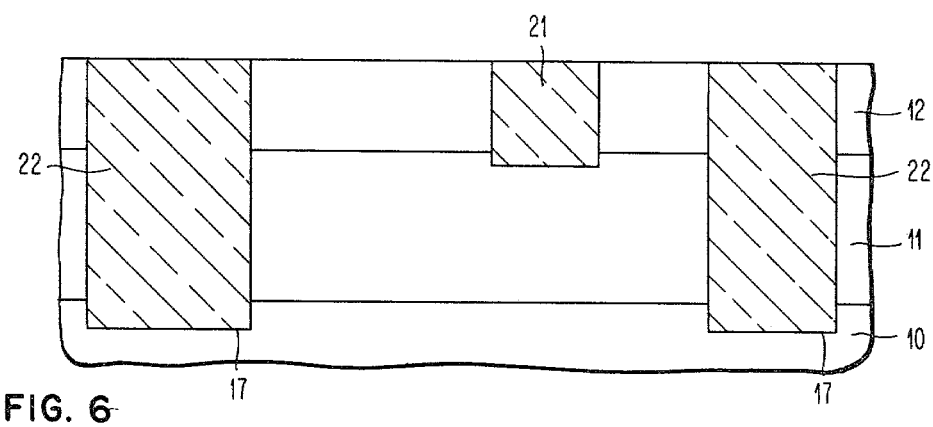

Referring now to FIGS. 5 and 6, the subsequent process step is to use RIE to thin back the resist layer 20 and the oxide layer 19. Of primary importance is that the RIE etch rate of resist is nearly equal to that of $SiO_2$. Thus, with an equal thickness of resist and $SiO_2$ everywhere over the wafer, a back-etching to silicon 12 will yield a planar surface with filled in shallow trench 21 and filled in deep trench 22 as shown in FIG. 6.

Figure 7:
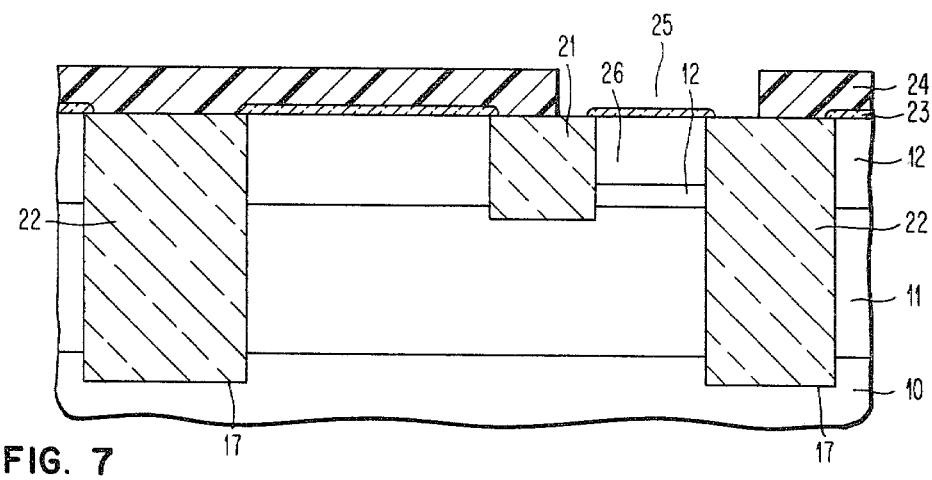

As demonstrated in FIG. 7, a $SiO_2$ layer 23, approximately 300Å thick, preferably formed by thermal oxidation, is grown on the silicon surface 12. A resist layer 24 is deposited on the wafer surface. The resist layer 24 is exposed and developed to form a block-out window 25 which overlies the intended transistor reach through region. A suitable N-type impurity preferably phosphorous, is ion-implanted through oxide layer 23 into the epitaxial layer 12 to form N+ reach through region 26. The resist layer 24 is subsequently stripped.

Figure 9A:
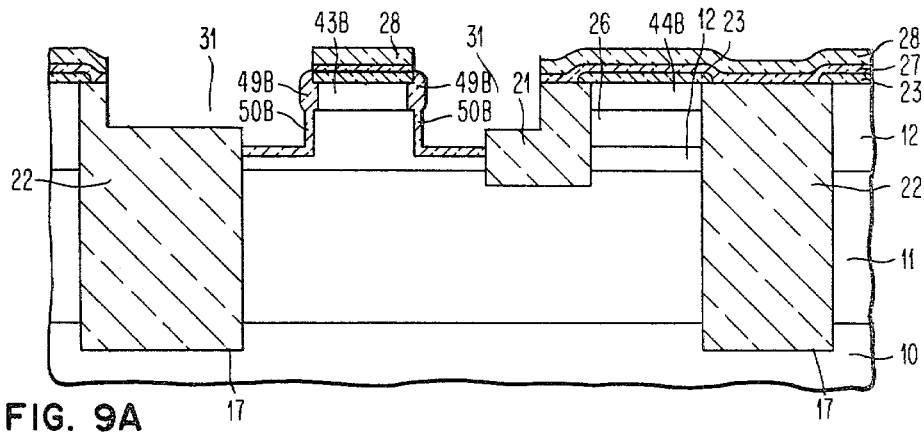
Figure 8:
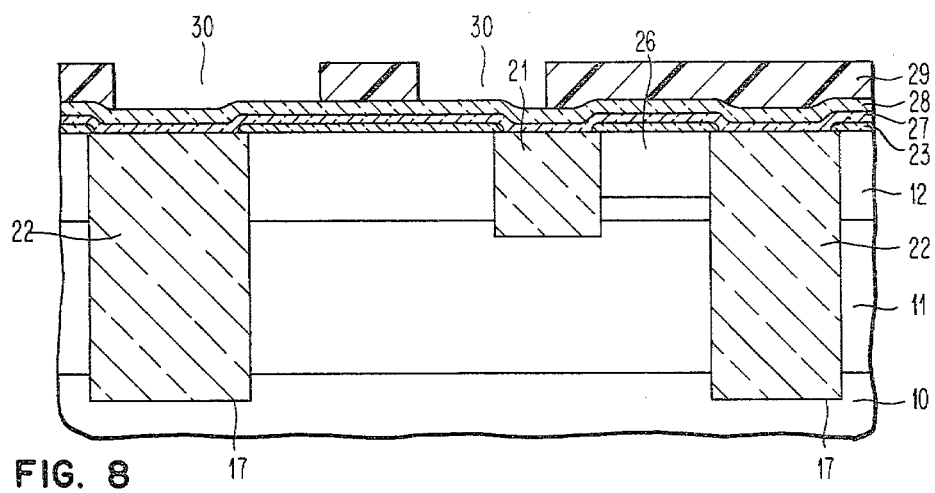
Figure 9:
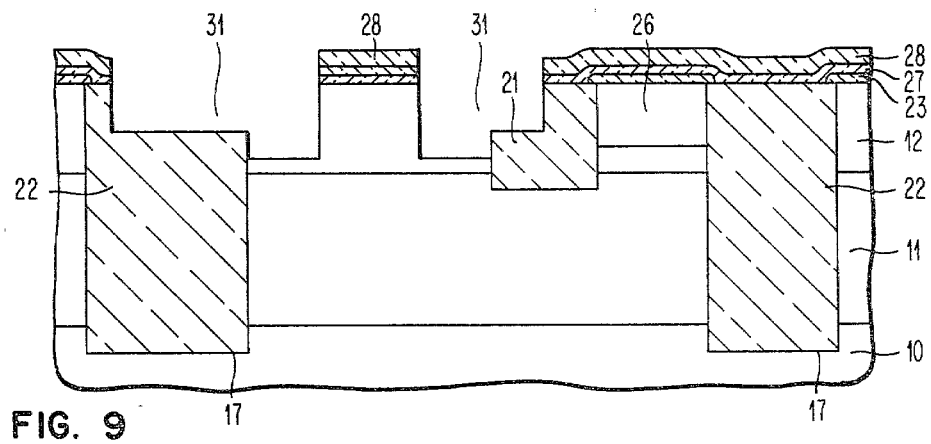

As shown in FIG. 8, a $Si_3N_4$ layer 27 of approximately 500Å thick is deposited on the wafer. A $SiO_2$ layer 28 is next formed on the $Si_3N_4$ layer 27. The thickness of the $SiO_2$ layer 28 is approximately 3000Å. Preferably both $Si_3N_4$ layer 27 and $SiO_2$ layer 28 are formed by CVD processes. As demonstrated in FIG. 8, a resist layer 29 is coated and subsequently exposed and developed to form an opening 30 which defines the intended polysilicon base contact region. Using the resist layer 29 as an etch mask, the $SiO_2$ layer 28, $Si_3N_4$ layer 27 and $SiO_2$ layer 23 are etched by using an RIE process. Preferably, $CF_4/H_2$ RIE which has a very small silicon etch rate is used to etch the $SiO_2/Si_3N_4/SiO_2$ layer. An RIE process which has a comparable etch rate for $SiO_2$ and Si is then used to etch into the epitaxial layer 12 and the oxide isolation trenches 21 and 22. The etched depth is determined by either the numbers of the fringes displayed by the end-point detector or by the etching time. As shown in FIG. 9, the RIE etched groove 31 has nearly vertical sidewalls.

Figure 10:
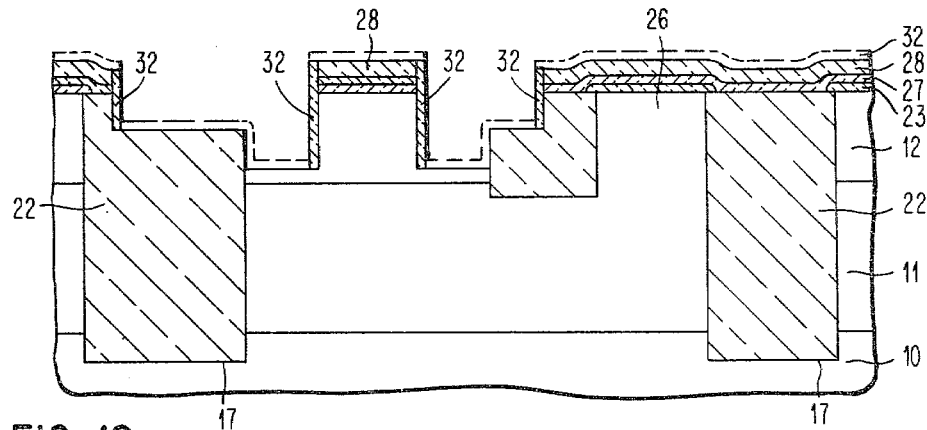

As shown in FIG. 10, a conformal CVD $Si_3N_4$ layer 32, approximately 800Å thick, is deposited onto the surface of the device structure. A blanket RIE process is then used to directionally remove the deposited $Si_3N_4$ layer 32 indicated by the dash line. The $Si_3N_4$ layer 32 formed on the device sidewalls would not be stripped by the directional RIE.

Figure 11A:
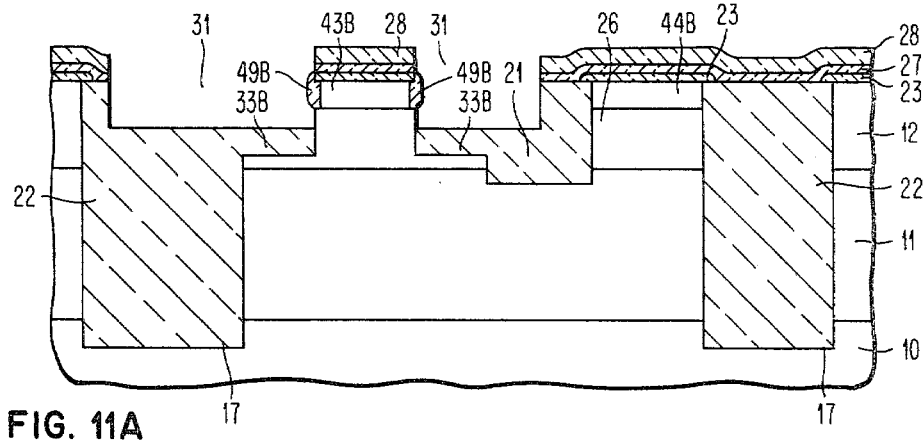
Figure 11:
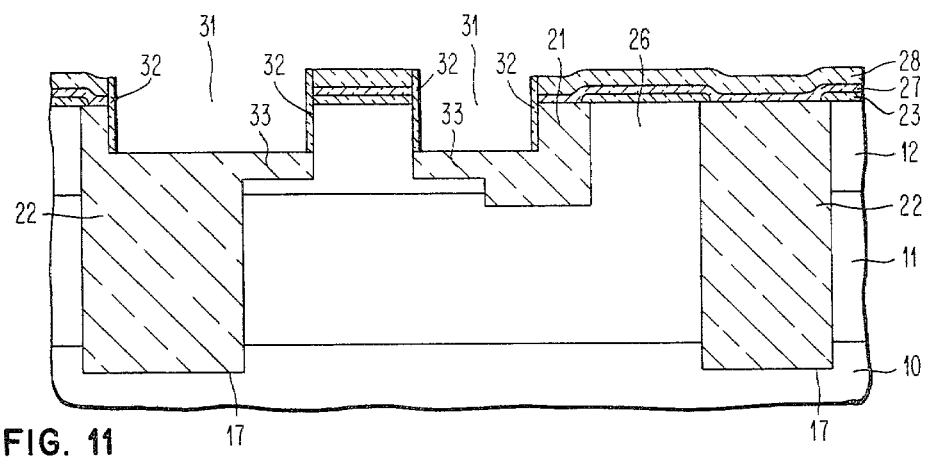

With $Si_3N_4$ layer 32 protecting the device sidewalls, as shown in FIG. 11, the exposed silicon at the bottom of the groove 31 is thermally oxidized to form a thick $SiO_2$ layer 33. The $SiO_2$ layer 33 is approximately 3000Å thick and, preferably, is formed by a low temperature-high pressure oxidation process so as to minimize outdiffusion of the N+ buried layer 11. After formation of $SiO_2$ layer 33, the sidewall $Si_3N_4$ layer 32, is then removed by using warm $H_3PO_4$ solution.

Figure 12:
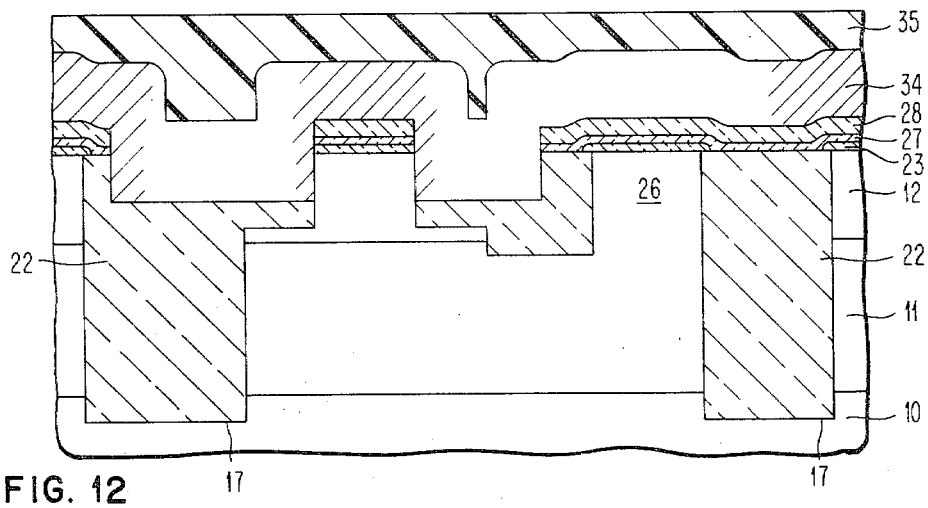

As illustrated in FIG. 12, a heavily doped P-type polysilicon layer 34 is deposited on the wafer to fill the groove. The polysilicon layer 34 is formed preferably by a low pressure CVD process to achieve good thickness uniformity. Doping of the polysilicon layer 34 can be done in-situ during CVD. Alternatively intrinsic polysilicon can be deposited and subsequently doped by boron implantation. A resist layer 35 is next deposited and treated appropriately to obtain planarization of the wafer surface.

Figure 13:
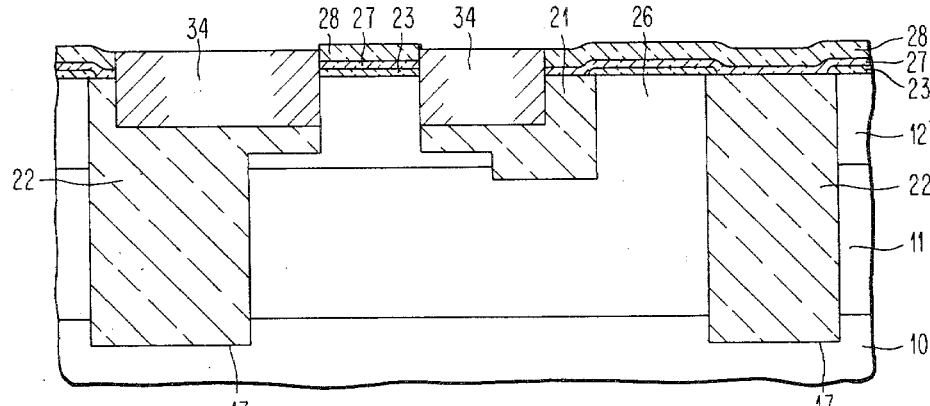

The subsequent process step is to etch back the resist layer 35 and polysilicon layer 34 by RIE. The RIE etch rate of resist 35 is preferably equal to or slightly less than that of polysilicon 34. When the $SiO_2$ layer 28 is reached, as shown in FIG. 13, the etch-back is stopped. Subsequently, the $SiO_2$ layer 28 is stripped by using buffer-HF solution.

Figure 14:
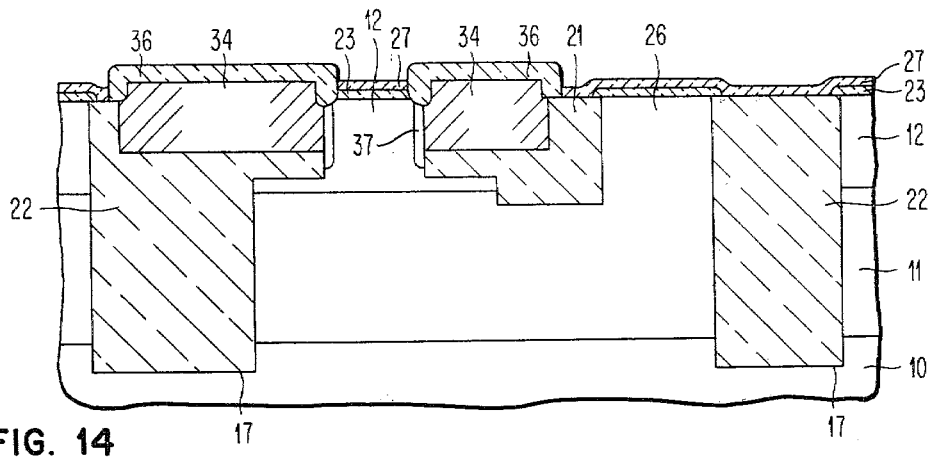

Referring to FIG. 14, a thermal oxidation is performed to grow a relatively thick oxide layer 36 on the exposed polysilicon 34. The thickness of the oxide layer 36 is approximately 2000Å and preferably is formed by a low temperature-high pressure oxidation process. The low temperature oxidation minimizes outdiffusion of P-type impurity from polysilicon 34 into the epitaxial silicon 12. Outdiffusion of P-type impurity forms a thin sleeve of P-region 37 in the N-type epitaxial silicon region 12. This P-region 37 is the external base of the intended transistor. Subsequently, the $Si_3N_4$ layer 27 is stripped by using warm $H_3PO_4$ solution.

Figure 15:
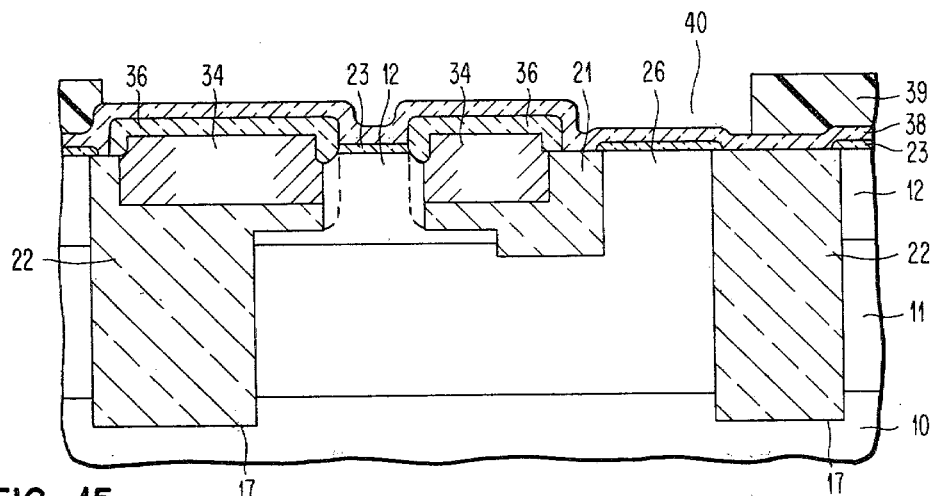
Figure 16:
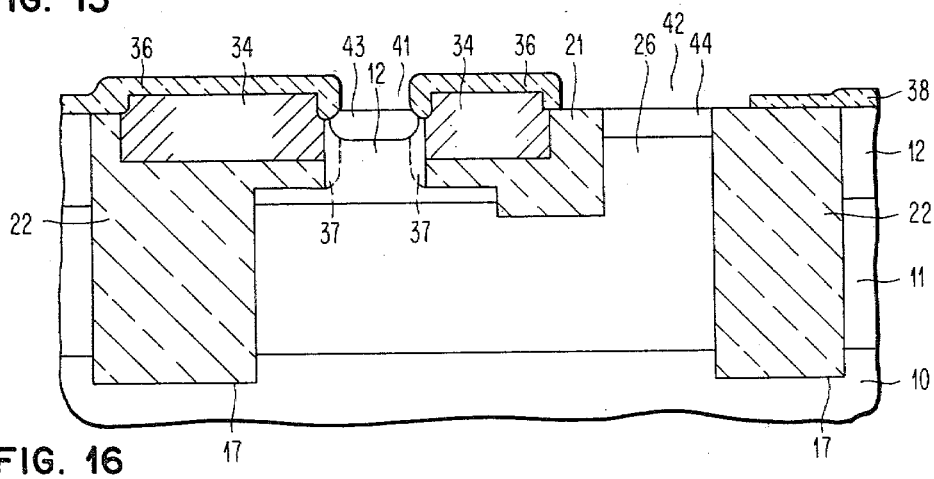

As shown in FIG. 15, a conformal $SiO_2$ layer 38 approximately 2000Å thick is formed by CVD process. A resist layer 39 is next coated and subsequently exposed and developed to form a block-out window 40 defining the transistor region. Referring to FIGS. 15 and 16 a $CF_4/H_2$ RIE is used to etch the deposited $SiO_2$ layer 38 and layer 23 to open the emitter contact 41 and collector contact 42. As can be seen in FIG. 16, the side-oxide which spaces the emitter contact 41 from polysilicon 34 is thicker than that of FIG. 14.

As demonstrated in FIG. 16, an N-type impurity is introduced into windows 41 and 42 forming the emitter 43 and collector contact 44. The impurity, preferably arsenic, can be introduced into the wafer by any suitable technique, as for example, capsule diffusion or ion implantation.

Figure 17:
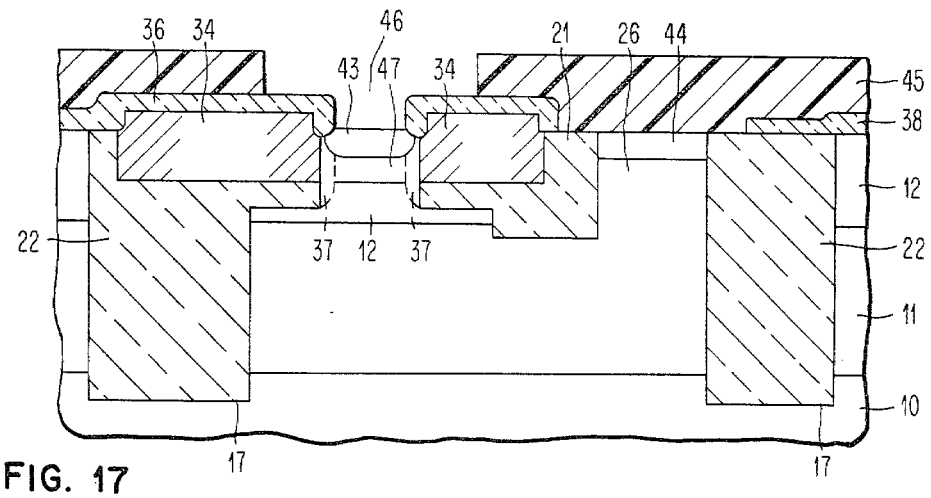

Referring now to FIG. 17, a resist layer 45 is applied and subsequently exposed and developed to form a block-out window 46 for intrinsic base boron implant. The boron implantation is made into epitaxial layer 12. The energy for boron implantation is such that its concentration peak is just beyond the emitter 43. The block-out resist layer 45 is then stripped, and the device is heat-treated at 900° C. to activate the implanted boron to form intrinsic base 47.

Figure 18:
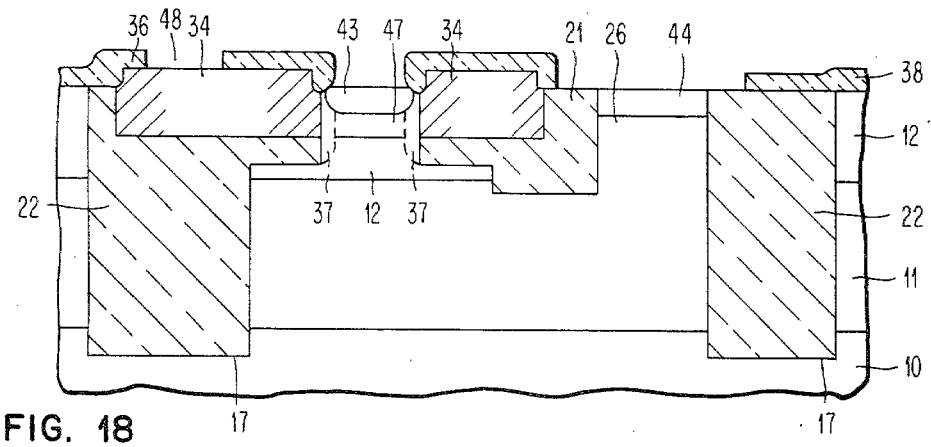
Figure 1B:
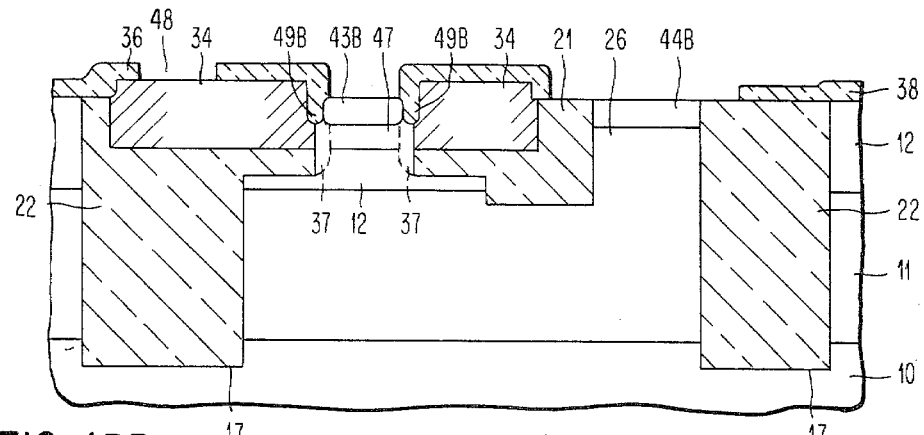

As shown in FIG. 18, a contact 48 to the P+ polysilicon is formed by lithography and an etching process. The device is then ready for metallization.

ALTERNATIVE PREFERRED EMBODIMENT

Figure 1A:
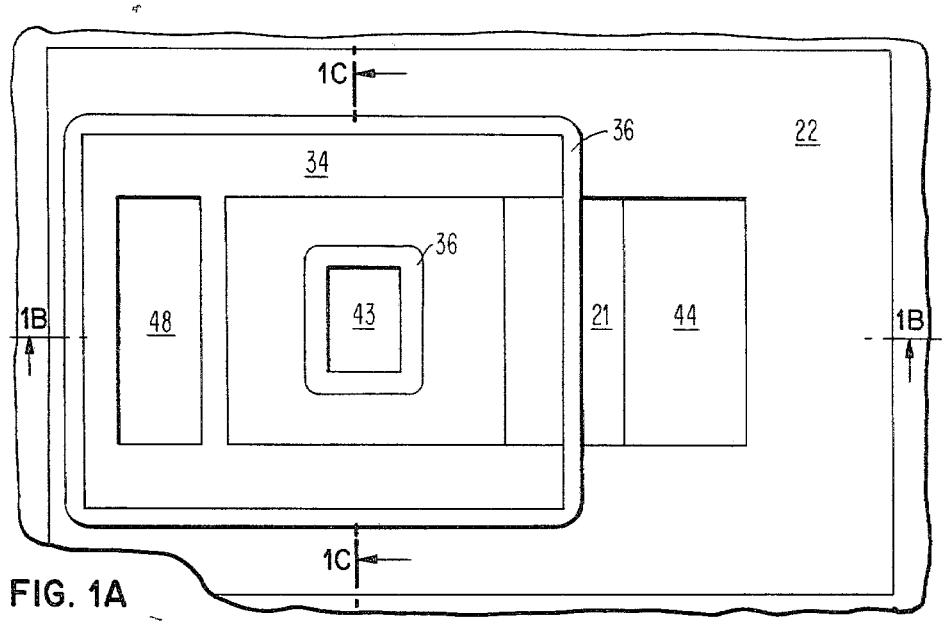
FIG. 1A is a top view of a transistor structure in accordance with the invention.
Figure 1B:
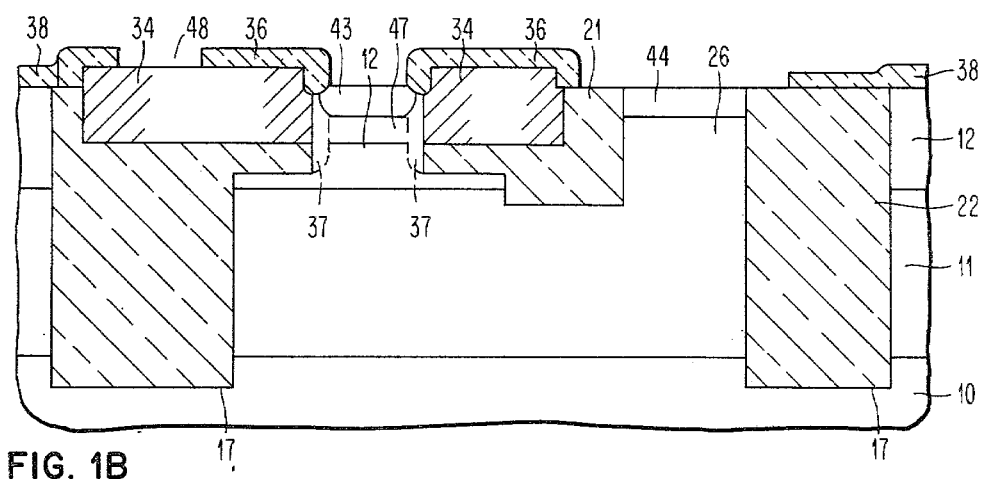
FIG. 1B is a cross-sectional view taken along the line 1B—1B of FIG. 1A.

A slight modification of the process described above leads to the improved transistor structure shown in FIG. 1BB. The transistor of FIG. 1BB has an improved emitter structure over that of FIG. 1B by having an oxide isolated sidewall 49B around the emitter sidewall. The dielectric sleeve 49B of the emitter eliminates the sidewall hole current component.

The process modification that is needed to obtain the transistor structure of FIG. 1BB is described as follows:

Referring to FIGS. 2 through 7, the initial process steps for forming the shallow 21 and deep 22 oxide isolation trenches and subsequently for formation of reach-through phosphorus implantation region 26 are the same as those described earlier herein.

Figure 7A:
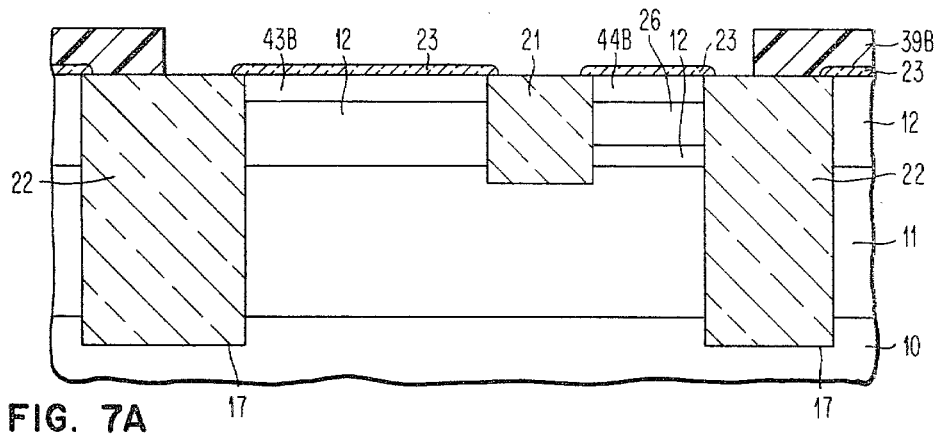

Reference is made to FIG. 7A for process deviation. It starts by forming a block-out resist mask 39B which defines the transistor region. An arsenic implant appropriate for forming N+ shallow emitter layer 43B is done into the wafer. This implant also provides collector reach through region 44B. After stripping the block-out resist mask 39B the wafer is then heat-treated to obtain a desired emitter junction depth.

Referring to FIGS. 8 and 9, the same processing steps which lead to formation of groove 31 (earlier herein) are used for the modified structure. the subsequent process is to use low temperature (800°-850° C.) oxidation to form a 2000Å thick layer of thermal oxide 49B on the sidewalls of the N+ doped emitter layer 43B. The oxide 50B that is grown on the sidewalls of the N− epitaxial layer 12 by the low temperature oxidation is less than 500Å. The structure is shown in FIG. 9A.

Referring to FIGS. 10 and 11, the processes that are used (earlier herein) for forming the sidewall Si$_3$N$_4$ layer 32 and formation of thick oxide 33 at the bottom of the groove 31 are also used for the modified structure. After formation of the oxide 33 at the bottom of the groove the Si$_3$N$_4$ layer 32 is stripped by using H$_3$PO$_4$ solution. The subsequent step is to use buffer-HF solution to etch oxide for a time more than sufficient to completely remove the thin oxide 50B formed on the sidewall of the N− epitaxial layer 12 but still leave a substantially thick side-oxide layer 49B around the N+ emitter sidewall. This modified structure is shown in FIG. 11A.

The subsequent process steps which lead to the fabrication of the improved transistor structure shown in FIG. 1BB are the same as set forth earlier herein (reference is made to FIGS. 12 through 18).

While the invention has been particularly shown and described with reference to the preferred embodiments thereof, it will be understood by those skilled in the art that various changes in form and detail may be made therein without departing from the spirit and scope of the invention.

We claim:

1. In a process for fabricating an improved bipolar transistor in a silicon substrate of a first conductivity type, said substrate having a planar surface, a subcollector region of a second conductivity type formed in said substrate, an epitaxial layer of said second conductivity type formed on said planar surface of said substrate, and first, second and third spaced apart recessed oxide isolation regions extending through said epitaxial layer into said substrate, said process including the following steps:
   a. forming a first oxide layer on said epitaxial layer;
   b. utilizing a suitable block-out mask, ion implanting impurities of a second conductivity type into the epitaxial surface extending from said second recessed oxide region to said third recessed oxide region thereby forming a collector reach through region;
   c. forming a first silicon nitride layer on said first oxide layer;
   d. forming a second oxide layer on said first silicon nitride layer;
   e. forming a mask having first and second spaced apart windows, said windows respectively exposing discrete regions of said second oxide layer, said first window extending over a portion of said first recessed oxide isolation region and a portion of said epitaxial layer in the direction of said second recessed oxide isolation region, said second window extending over a portion of said second recessed oxide isolation region and said epitaxial layer in the direction of said first recessed oxide isolation region;
   f. utilizing reactive-ion etch techniques and said first and second windows etching said second oxide layer, said first silicon nitride layer, said first oxide layer, the oxide isolation regions and said epitaxial layer to the surface of said subcollector region, whereby a narrow portion of the epitaxial layer remains between said first and second recessed oxide isolation regions, said narrow portion of the epitaxial layer having vertical sidewalls;
   g. removing said mask formed in step e;
   h. chemically vapor depositing (CVD) a second silicon nitride layer on the exposed surface of the substrate;
   i. utilize reaction ion etching (RIE) techniques removing predetermined portions of the second silicon nitride layer;
   j. forming an oxide layer over the exposed surface of the subcollector;
   k. removing the remaining portions of said second silicon nitride layer;
   l. forming a layer of doped polysilicon of said second conductivity type over the exposed surface of the substrate;
   m. utilizing photoresist planarizing the exposed surface of the substrate;
   n. utilizing reactive ion etch (RIE) techniques etching back said photoresist and polysilicon to stop at the surface of said second oxide layer;
   o. removing said second oxide layer; and
   p. forming by thermal oxidation an oxide coating on said polysilicon whereby, in addition to the forming of said oxide coating on said polysilicon, a thin sleeve shaped region having impurities of said first conductivity type is formed in said narrow portion of said epitaxial layer residing between said first and second recessed oxide isolation regions.

Figure 1C:
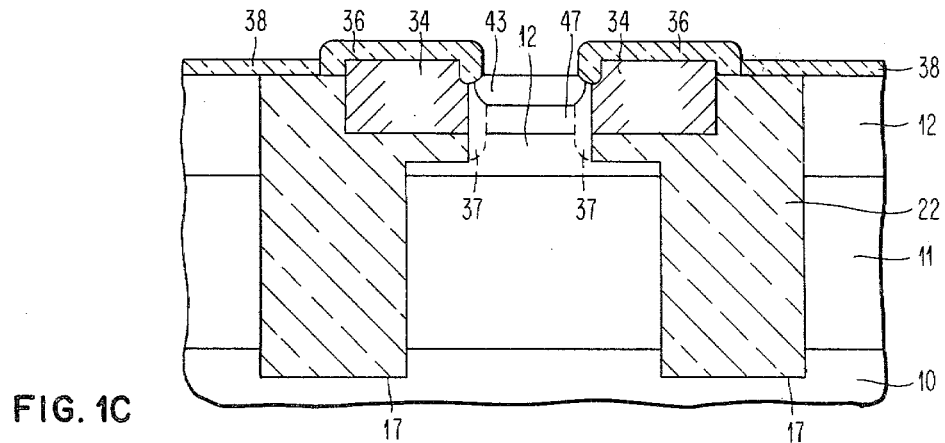
FIG. 1C is a cross-sectional view taken along the line 1C—1C of FIG. 1A.

2. In a process for fabricating an improved bipolar transistor (FIGS. 1A, 1B, 1C) in a silicon substrate of a first conductivity type, said substrate having a planar surface, a subcollector region of a second conductivity type formed in said substrate, an epitaxial layer of said second conductivity type formed on said planar surface of said substrate, and first, second and third spaced apart recessed oxide isolation regions extending through said epitaxial layer into said substrate, said process including the following steps:
   a. forming a first oxide layer (23, FIG. 7) on said epitaxial layer;
   b. utilizing a suitable block-out mask (24, FIG. 7) ion implanting impurities of a second conductivity type into the epitaxial surface extending from said second recessed oxide region to said third recessed oxide region thereby forming a collector reach through region (26, FIG. 7);

c. forming a first silicon nitride layer (27, FIG. 8) on said first oxide layer;
d. forming a second oxide layer (28, FIG. 8) on said first silicon nitride layer;
e. forming a mask having first and second spaced apart windows (30, FIG. 8), said windows respectively exposing discrete regions of said second oxide layer, said first window extending over a portion of said first recessed oxide isolation region and a portion of said epitaxial layer in the direction of said second recessed oxide isolation region, said second window extending over a portion of said second recessed oxide isolation region and said epitaxial layer in the direction of said first recessed oxide isolation region;
f. utilizing reactive-ion etch techniques and said first and second windows etching said second oxide layer, said first silicon nitride layer, said first oxide layer, the oxide isolation regions and said epitaxial layer to the surface of said subcollector region, whereby a narrow portion of the epitaxial layer remains between said first and second recessed oxide isolation regions, said narrow portion of the epitaxial layer having vertical sidewalls (FIG. 9);
g. removing said mask formed in step e;
h. chemically vapor depositing (CVD) a second silicon nitride layer (32, FIG. 10) on the exposed surface of the substrate;
i. utilize reactive ion etching (RIE) techniques removing predetermined portions of the second silicon nitride layer (32, FIG. 10);
j. forming an oxide layer (33, FIG. 11) over the exposed surface of the subcollector;
k. removing the remaining portion of said second silicon nitride layer (32, FIG. 12);
l. forming a layer (34, FIG. 12) of doped polysilicon of a second conductivity type over the exposed surface of the substrate;
m. utilizing photoresist (35, FIG. 12) planarizing the exposed surface of the substrate;
n. utilizing reactive ion etch (RIE) techniques etching back said photoresist and polysilicon to stop at the surface of said second oxide layer (FIG. 13);
o. removing said second oxide layer (28, FIG. 14);
p. forming by thermal oxidation an oxide coating (36, FIG. 14) on said polysilicon, whereby, in addition to the forming of said oxide coating on said polysilicon, a thin sleeve shaped region (37, FIG. 14) having impurities of said first conductivity type is formed in said narrow portion of said epitaxial layer residing between said first and second recessed oxide isolation regions;
q. removing said first layer (27, FIG. 14) of silicon nitride and first layer (23, FIG. 14) of oxide over emitter and collector contact areas;
r. ion implanting an emitter region (43, FIG. 16) with impurities of the second conductivity type; and
s. ion implanting an active base region (47, FIG. 17) with impurities of the first conductivity type.

3. In a process for fabricating an improved bipolar transistor (FIG. 1BB) in a silicon substrate of a first conductivity type, said substrate having a planar surface, a subcollector region of a second conductivity type formed in said substrate, an epitaxial layer of said second conductivity type formed on said planar surface of said substrate, and first, second and third spaced apart recessed oxide isolation regions extending through said epitaxial layer into said substrate, said process including the following steps:
a. forming a first oxide layer (23, FIG. 7) on said epitaxial layer;
b. utilizing a suitable block-out mask (24, FIG. 7) ion implanting impurities of a second conductivity type into the epitaxial surface extending from said second recessed oxide region to said third recessed oxide region thereby forming a collector reach through region (26, FIG. 7);
c. forming a block out mask (39B, FIG. 7A) to define the transistor region;
d. implanting ions of said second conductivity type to provide said emitter region (43B FIG. 7A) and said collector reach through region (44B, FIG. 7A);
e. forming a first silicon nitride layer (27, FIG. 8) on said first oxide layer;
f. forming a second oxide layer (28, FIG. 8) on said first silicon nitride layer;
g. forming a mask having first and second spaced apart windows (30, FIG. 8), said windows respectively exposing discrete regions of said second oxide layer, said first window extending over a portion of said first recessed oxide isolation region and a portion of said epitaxial layer in the direction of said second recessed oxide isolation region, said second window extending over a portion of said second recessed oxide isolation region and said epitaxial layer in the direction of said first recessed oxide isolation region;
h. utilizing reactive-ion etch techniques and said first and second windows etching said second oxide layer, said first silicon nitride layer, said first oxide layer, the oxide isolation regions and said epitaxial layer to the surface of said subcollector region, whereby a narrow portion of the epitaxial layer remains between said first and second recessed oxide isolation regions, said narrow portion of the epitaxial layer having vertical sidewalls (FIG. 9);
i. removing said mask formed in step g;
j. forming, by low temperature oxidation, a 2000Å thick oxide layer (49B, FIG. 9A) on exposed sidewalls of emitter region (43B, FIG. 9A) and a 500Å thick oxide layer (50B, FIG. 94) on epitaxial layer (12, FIG. 9A);
k. chemically vapor depositing (CVD) a second silicon nitride layer (32, FIG. 10) on the exposed surface of the substrate;
l. utilize reactive ion etching (RIE) techniques removing predetermined portions of the second silicon nitride layer (32, FIG. 10);
m. forming an oxide layer (33, FIG. 11) over the exposed surface of the subcollector;
n. removing the remaining portions of said second silicon nitride layer (32, FIG. 11);
o. using an oxide etching solution, etching for a sufficient time to remove the thin oxide (50B, FIG. 11A) on the sidewalls of the epitaxial layer (12, FIG. 11A);
p. forming a layer (34, FIG. 12) of doped polysilicon of a second conductivity type over the exposed surface of the substrate;
q. utilizing photoresist (35, FIG. 12) planarizing the exposed surface of the substrate;
r. utilizing reactive ion etch (RIE) techniques etching back said photoresist and polysilicon to stop at the surface of said second oxide layer (FIG. 13);
s. removing said second oxide layer (28, FIG. 14);

t. forming by thermal oxidation an oxide coating (36, FIG. 14) on said polysilicon, whereby, in addition to the forming of said oxide coating on said polysilicon, a thin sleeve shaped region (37, FIG. 1BB), having impurities of said first conductivity type, is formed in said narrow portion of said epitaxial layer residing between said first and second recessed oxide isolation regions;

u. removing said first layer (27, FIG. 14) of silicon nitride and said first layer (23, FIG. 14) of oxide over emitter and collector contact areas; and v. ion implanting an active base region (47, FIG. 1BB) with impurities of the first conductivity type.

4. In a process for fabricating an improved bipolar transistor in a silicon substrate of a first conductivity type, said substrate having a planar surface, a subcollector region of a second conductivity type formed in said substrate, an epitaxial layer of said second conductivity type formed on said planar surface of said substrate, and first, second and third spaced apart recessed oxide isolation regions extending through said epitaxial layer into said substrate, said process including the following steps:

a. forming a first oxide layer on said epitaxial layer;
   b. utilizing a suitable block-out mask ion implanting impurities of a second conductivity type into the epitaxial surface extending from said second recessed oxide region to said third recessed oxide region thereby forming a collector reach through region;
   c. forming a block-out mask to define the transistor region;
   d. implanting ions of said second conductivity type to provide said emitter region and said collector reach through region;
   e. forming a first silicon nitride layer on said first oxide layer;
   f. forming a second oxide layer on said first silicon nitride layer;
   g. forming a mask having first and second spaced apart windows, said windows respectively exposing discrete regions of said second oxide layer, said first window extending over a portion of said first recessed oxide isolation region and a portion of said epitaxial layer in the direction of said second recessed oxide isolation region, said second window extending over a portion of said second recessed oxide isolation region and said epitaxial layer in the direction of said first recessed oxide isolation region;
   h. utilizing reactive-ion etch techniques and said first and second windows etching said second oxide layer, said first silicon nitride layer, said first oxide layer, the oxide isolation regions and said epitaxial layer to the surface of said subcollector region, whereby a narrow portion of the epitaxial layer remains between said first and second recessed oxide isolation regions, said narrow portion of the epitaxial layer having vertical sidewalls;
   i. removing said mask formed in step g;
   j. forming, by low temperature oxidation, a 2000Å thick oxide layer on exposed sidewalls of emitter region and a 500Å thick oxide layer on epitaxial layer;
   k. chemically vapor depositing (CVD) a second silicon nitride layer on the exposed surface of the substrate;
   l. utilize reactive ion etching (RIE) techniques removing predetermined portions of the second silicon nitride layer;
   m. forming an oxide layer over the exposed surface of the subcollector;
   n. removing the remaining portions of said second silicon nitride layer;
   o. using an oxide etching solution, etching for a sufficient time to remove the thin oxide on the sidewalls of the epitaxial layer;
   p. forming a layer of doped polysilicon of a second conductivity type over the exposed surface of the substrate;
   q. utilizing photoresist planarizing the exposed surface of the substrate;
   r. utilizing reactive ion etch (RIE) techniques etching back said photoresist and polysilicon to stop at the surface of said second oxide layer;
   s. removing said second oxide layer;
   t. forming by thermal oxidation an oxide coating on said polysilicon, whereby, in addition to the forming of said oxide coating on said polysilicon, a thin sleeve shaped region, having impurities of said first conductivity type, is formed in said narrow portion of said epitaxial layer residing between said first and second recessed oxide isolation regions;
   u. removing said first layer of silicon nitride and said first layer of oxide over emitter and collector contact areas; and
   v. ion implanting an active base region with impurities of the first conductivity type.

* * * * *

UNITED STATES PATENT AND TRADEMARK OFFICE
CERTIFICATE OF CORRECTION

PATENT NO. : 4,338,138

DATED : July 6, 1982

INVENTOR(S) : Joseph R. Cavaliere et al

It is certified that error appears in the above—identified patent and that said Letters Patent is hereby corrected as shown below:

Column 10, line 44        "FIG. 94" should read --FIG. 9A--.

Signed and Sealed this

Eleventh Day of September 1984

[SEAL]

Attest:

GERALD J. MOSSINGHOFF

Attesting Officer     Commissioner of Patents and Trademarks